United States Patent
Choi et al.

(10) Patent No.: US 11,942,336 B2
(45) Date of Patent: Mar. 26, 2024

(54) UNDERFILL FILM FOR SEMICONDUCTOR PACKAGE AND METHOD FOR MANUFACTURING SEMICONDUCTOR PACKAGE USING THE SAME

(71) Applicant: DOOSAN CORPORATION, Seoul (KR)

(72) Inventors: Taejin Choi, Yongin-si (KR); Chunggu Lee, Yongin-si (KR); Sooin Park, Yongin-si (KR); Jungjin Lee, Yongin-si (KR)

(73) Assignee: DOOSAN CORPORATION, Seoul (KR)

( * ) Notice: Subject to any disclaimer, the term of this patent is extended or adjusted under 35 U.S.C. 154(b) by 193 days.

(21) Appl. No.: 17/404,009

(22) Filed: Aug. 17, 2021

(65) Prior Publication Data

US 2022/0199430 A1    Jun. 23, 2022

(30) Foreign Application Priority Data

Dec. 23, 2020  (KR) .......................... 10-2020-0182150

(51) Int. Cl.
| | |
|---|---|
| *H01L 21/56* | (2006.01) |
| *C09J 7/38* | (2018.01) |
| *C09J 7/40* | (2018.01) |
| *C09J 163/00* | (2006.01) |
| *H01L 23/00* | (2006.01) |

(52) U.S. Cl.
CPC .............. *H01L 21/563* (2013.01); *C09J 7/38* (2018.01); *C09J 7/405* (2018.01); *C09J 163/00* (2013.01); *H01L 24/92* (2013.01); *C09J 2203/326* (2013.01); *C09J 2463/00* (2013.01); *C09J 2467/005* (2013.01); *H01L 2224/92125* (2013.01)

(58) Field of Classification Search
CPC ....... H01L 23/291; H01L 24/81; H01L 24/92; H01L 21/563
See application file for complete search history.

(56) References Cited

U.S. PATENT DOCUMENTS

| | | | |
|---|---|---|---|
| 6,838,170 | B2 | 1/2005 | Tanaka et al. |
| 7,776,993 | B2 | 8/2010 | Buchwalter et al. |
| 10,357,407 | B2 * | 7/2019 | Bunnelle ................ C08L 23/22 |
| 2020/0098719 | A1 * | 3/2020 | Park .................... H01L 23/3192 |
| 2021/0292618 | A1 * | 9/2021 | Kim ..................... C08G 59/504 |

FOREIGN PATENT DOCUMENTS

| | | |
|---|---|---|
| JP | 2000-299328 A | 10/2000 |
| JP | 2016-201418 A | 12/2016 |
| TW | 201728660 A | 8/2017 |

* cited by examiner

*Primary Examiner* — Dale E Page
*Assistant Examiner* — Wilner Jean Baptiste
(74) *Attorney, Agent, or Firm* — Sughrue Mion, PLLC

(57) ABSTRACT

An underfill film for semiconductor packages and a method for manufacturing a semiconductor package using the underfill film are disclosed. The underfill film includes an adhesive layer in which a melt viscosity and an onset temperature are adjusted to a predetermined range such that production efficiency may be improved by simplifying packaging process of the semiconductor packages. Also the underfill film and the manufacturing process may improve connection reliability of the package.

8 Claims, 3 Drawing Sheets

UNDERFILL FILM FOR SEMICONDUCTOR PACKAGE AND METHOD FOR MANUFACTURING SEMICONDUCTOR PACKAGE USING THE SAME

CROSS-REFERENCE TO RELATED APPLICATION

This application claims priority under 35 U.S.C. § 119 to Korean Patent Application No. 10-2020-0182150, filed on Dec. 23, 2020, in the Korean Intellectual Property Office (KIPO), the disclosure of which is incorporated by reference herein in its entirety.

TECHNICAL FIELD

Embodiments of the present invention relate to an underfill film for semiconductor packages and a method for manufacturing a semiconductor package using the same, and more particularly, to an underfill film for semiconductor packages and a method for manufacturing a semiconductor package using the same capable of simplifying semiconductor chip transfer and bonding process and increasing manufacturing efficiency by using a chip placement mechanism, while improving reliability of the package.

DISCUSSION OF RELATED ART

Recently, with the trend of miniaturization and high density of electronic devices, a flip-chip package manufacturing method capable of mounting semiconductor devices with a lowest area has been garnering attention.

In manufacturing flip chip packages, an underfill is disposed in a space between a semiconductor chip and a package substrate. The underfill not only protects the package structure from external influences such as mechanical shock and corrosion of a bonding portion, but also substantially minimizes the stress caused by a difference in coefficient of thermal expansion between the chip and the substrate, thereby improving reliability of the package product.

Such an underfill may be formed by performing a solder reflow process and then filling the space between the semiconductor chip and the package substrate with a liquid underfill resin using equipment such as a needle, followed by curing the liquid underfill resin. However, in the filling process of the liquid underfill resin, it is necessary to apply the underfill resin uniformly throughout the entire area of the empty space between the semiconductor chip and the package substrate. Accordingly, not only that a needle movement space needs to be secured to move the needle along a side surface of the semiconductor chip in a constant trajectory, but also an extra space for arranging the needle needs to be secured. For this reason, it is space-consuming, which may be an obstacle to miniaturization of products using flip chips. In addition, in the filling process of the liquid underfill resin, a diffusion rate of the liquid underfill resin may vary due to a circuit pattern and a bonding pad of a printed circuit board and a solder of the semiconductor chip, resulting in air gaps or voids in the underfill. Such air gaps or voids not only degrade the underfill function, but also cause moisture permeation in the long term, and thus the reliability of the package may be lowered.

Meanwhile, with the recent trend of miniaturization of semiconductor devices, interest in a wafer level package technology is increasing. The wafer level package technology is a semiconductor packaging technology that completes assembly on a wafer where chips are not separated, which is dissimilar to the conventional method in which each single semiconductor chip is cut from the wafer to be packaged. When such semiconductor package technology is applied, the semiconductor assembly process such as wiring connection and plastic packaging may be shortened, and accordingly, cost may be reduced through process simplification.

In current semiconductor packaging, a transfer process of a semiconductor chip, a bonding process between the transferred semiconductor chip and a package substrate, and a reflow process under high temperature are each performed separately, and thus there has been a limit to increasing production efficiency by simplifying the packaging process without degrading physical properties. As such, there is an urgent need to develop a novel bonding material and a semiconductor package manufacturing process using the novel bonding material capable of simplifying the semiconductor packaging process by applying the wafer level package technology, while improving the reliability of the package.

SUMMARY

The present inventors have recognized that performing a reflow process after using a chip placement method in which semiconductor chips are individually picked up, horizontally transferred to a holder of a bonding equipment, and aligned in a predetermined position may automate the semiconductor packaging process, significantly increase the production efficiency by reducing material loss and downtime and simplify the packaging process compared to the conventional art.

Accordingly, embodiments of the present invention may be directed to an underfill film for semiconductor packages optimized for a chip placement method that may simplify transfer and bonding processes during semiconductor packaging, while improving connection reliability.

Embodiments of the present invention may also be directed to a method for manufacturing a semiconductor package having excellent connection reliability, while simplifying a bonding process and improving production efficiency by using the above-described underfill film.

Other objectives and advantages of the present invention may be more clearly explained by the following detailed description and claims.

According to an embodiment, an underfill film for semiconductor packages includes: a base; and an adhesive layer disposed on one surface of the base, having a melt viscosity in a range of 300 to 1000 Pa·s at 150 to 160° C., and having an onset temperature of 145±5° C. on a differential scanning calorimeter (DSC).

In some embodiments, the underfill film may be used in a chip placement manner for picking up a semiconductor chip to which the adhesive layer is bonded and bonding it to a package substrate supported by a bonding stage.

In some embodiments, the onset temperature of the adhesive layer may be substantially equal to a preset pre-heat temperature (Ts) of the bonding stage.

In some embodiments, a thickness of the adhesive layer may be in a range of 80 to 120% of a gap between the semiconductor chip and the package substrate.

In some embodiments, the adhesive layer may have a peak temperature of 165±5° C. on a differential scanning calorimetry (DSC), and a difference between the onset temperature and the peak temperature may be 25±5° C.

In some embodiments, the adhesive layer may be a cured product or a semi-cured product of an adhesive resin composition, the adhesive resin composition including: (a) an epoxy resin containing a liquid epoxy resin, a phenoxy resin and a polyfunctional epoxy resin; (b) an acid anhydride curing agent; (c) a nitrogen (N)-containing heterocyclic compound; and (d) a filler.

In some embodiments, a mixing ratio of the polyfunctional epoxy resin, the phenoxy resin, and the liquid epoxy resin may be 4:3 to 4:2 to 3 by weight.

In some embodiments, the acid anhydride curing agent may be included in an amount in a range of 0.3 to 1.0 equivalents of anhydride with respect to 1 equivalent of the epoxy resin.

In some embodiments, the nitrogen-containing heterocyclic compound may be included in an amount of 0.005 equivalents or more and less than 0.02 equivalents with respect to 1 equivalent of the acid anhydride curing agent.

According to another embodiment, a method for manufacturing a semiconductor package includes: (i) bonding the adhesive layer of the aforementioned underfill film on a bump of a semiconductor chip provided with the bump; (ii) picking up the bump of the semiconductor chip to which the adhesive layer is bonded, and aligning the bump on a bonding pad of a package substrate supported on a bonding stage; (iii) putting the aligned semiconductor chip and package substrate into a pressure chamber oven; (iv) melting the bump of the semiconductor chip to connect the semiconductor chip and the package substrate; and (v) curing the adhesive layer disposed between the connected semiconductor chip and package substrate.

In some embodiments, in (ii), picking up and aligning may be performed in a chip placement manner.

In some embodiments, the bonding stage in step (ii) may be preheated to a set temperature (Ts) substantially equal to an onset temperature of the adhesive layer included in the underfill film.

In some embodiments, in (ii), aligning of the bump and the bonding pad may be performed by pressing under conditions of a stage temperature of 130 to 150° C., a die bonder head at room temperature, 10 to 200 N, and 1 to 5 seconds.

In some embodiments, in (iv), after melting the bump, a void area ratio in the adhesive layer may be 1.0% or less.

In some embodiments, in (v), a curing temperature of the adhesive layer may be in a range of 160 to 250° C.

BRIEF DESCRIPTION OF THE DRAWINGS

A more complete appreciation of the present invention will become more apparent by describing in detail embodiments thereof with reference to the accompanying drawings, wherein.

Figure 1:
FIG. 1 is a cross-sectional view illustrating a structure of an underfill film for semiconductor packages according to a first embodiment of the present invention.

REFERENCE NUMERALS 10A, 10B: underfill film
11: Base
12: Adhesive layer
12″: Cured adhesive layer
13: Second base
20: Semiconductor chip
21: Bump
30: Package substrate
31: Bonding pad

DETAILED DESCRIPTION

Embodiments and examples of the present invention are provided to better explain the present invention to those of ordinary skill in the art, and embodiments given below may be modified in various manners and have several embodiments, but the scope of the present invention is not limited to the embodiments. Throughout the specification, like reference numerals generally indicate identical, functionally similar, and/or structurally similar elements. It is to be understood that all terms (including technical and scientific terms) used in the present disclosure have meanings generally understood by those of ordinary skill in the technical field to which the present disclosure belongs, unless otherwise defined. In addition, terms defined in a commonly used dictionary are not to be interpreted ideally or excessively unless clearly defined in particular.

In addition, since the size and thickness of each component illustrated in the drawings are arbitrarily indicated for convenience of description, the present invention is not necessarily limited to the drawings. In order to clearly express various layers and regions in the drawings, the thicknesses are enlarged. In addition, for convenience of description, the thickness of some layers and regions are exaggerated in the drawings.

It is to be understood that terms, such as "comprising", "including", "having" and the like, used herein are open-ended terms that imply the possibility of including other embodiments, rather than excluding other components, unless otherwise stated. In addition, throughout the specification, "above" or "on" means not only when it is located on or beneath the target part, but also includes the case where there is another part therebetween, and it does not necessarily mean that it is positioned above with respect to the direction of gravity. Terms such as "first" and "second" used herein are used to distinguish a plurality of components from each other, and do not limit the order or importance of the components. In addition, when a component is referred to as being "connected" or "coupled" to another component, it is to be understood that the component may be directly connected to or coupled to the other component, or that it may be connected or may be "connected" or "coupled" via other components disposed therebetween. In addition, throughout the specification, the term "planar" may mean when the target part is viewed from above, and term "cross-section" may mean when viewed from the side of the target part that is vertically cut.

<Underfill Film for Semiconductor Package>

Figure 2:
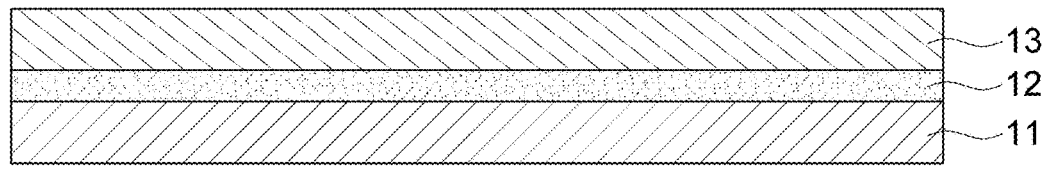
FIG. 2 is a cross-sectional view illustrating a structure of an underfill film for semiconductor packages according to a second embodiment of the present invention.

FIG. 1 is a cross-sectional view illustrating a structure of an underfill film for semiconductor packages according to a first embodiment of the present invention, and FIG. 2 is a cross-sectional view illustrating a structure of an underfill film for semiconductor packages according to a second embodiment of the present invention.

Underfill films 10A and 10B according to the present invention are non-conductive adhesive films used to relieve stress applied to a connecting portion between a bump of a semiconductor chip and a bonding pad of a package substrate during semiconductor packaging, and specifically has properties optimized for a chip placement mechanism.

As illustrated in FIGS. 1 and 2, the underfill films 10A and 10B include a base (e.g., substrate) 11 and an adhesive layer 12 disposed on one surface of the base. Optionally, another base (hereinafter, "second base") 13 disposed on another surface of the adhesive layer may be further included (see FIG. 2).

Hereinafter, an underfill film 10A for semiconductor packages according to the first embodiment of the present invention will be described with reference to FIG. 1.

Base

In the underfill film according to the present invention, the base 11 is a portion for protecting a surface of the adhesive layer while supporting the adhesive layer and is delaminated (e.g., detached) and removed when the underfill film is in use.

As the base 11, any plastic film commonly known in the art as long as it may be delaminated may be used without limitation, and a release paper may also be used.

Non-limiting examples of the applicable plastic films may include polyester films such as polyethylene terephthalate (PET), polybutylene terephthalate, and polyethylene naphthalate, polyethylene films, polypropylene films, cellophane, diacetylcellulose films, triacetylcellulose films, acetylcellulose butyrate film, polyvinyl chloride film, polyvinylidene chloride film, polyvinyl alcohol film, ethylene-vinyl acetate copolymer film, polystyrene film, polycarbonate film, polymethylpentene film, polysulfone film, polyether ether ketone film, polyethersulfone film, polyetherimide film, polyimide film, fluororesin film, polyamide film, acrylic resin film, norbornene-based resin film, cycloolefin resin film, and the like. Such plastic films may be transparent or translucent or may be colored or uncolored. As an example, the base 11 may be polyethylene terephthalate (PET). As another example, the base 11 may be polyimide (PI).

A release layer may be disposed on such a plastic film. When the base 11 is separated from the adhesive layer 12, the release layer facilitates separation of the adhesive layer from the base while maintaining the shape of the adhesive layer without damage. In such an embodiment, the release layer may be a commonly used film-type release material.

A component of the release material used in the release layer is not particularly limited, and any conventional release component known in the art may be used. Non-limiting examples thereof may include an epoxy-based release agent, a release agent made of a fluororesin, a silicone-based release agent, an alkyd resin-based release agent, a water-soluble polymer, and the like. In addition, if necessary, a component of the release layer may include a powder filler such as silicon, silica, and the like. In such a case, as the powder filler in the form of fine particles, two-types of powder fillers may be mixed with each other, and their average particle size may be appropriately selected in consideration of the surface roughness to be formed. addition, a thickness of the release layer may be appropriately adjusted within a conventional range known in the art. A method for forming the release layer is not specifically limited, and any well-known methods, such as heat press, heated roll lamination, extrusion lamination, application of a coating liquid, and drying, may be applicable.

A thickness of the base 11 is not particularly limited and may be adjusted within a conventional range known in the art, for example, in a range of about 25 to 150 µm, specifically in a range of about 30 to 100 µm, more specifically in a range of about 30 to 50 µm. In addition, a release force of the base 11 is not particularly limited, and may be, for example, in a range of about 1 to 500 gf/inch, and specifically in a range of about 10 to 100 gf/inch.

Adhesive Layer

In the underfill film according to the present invention, the adhesive layer 12, disposed on one surface of the base 11, may bond a semiconductor chip to a package substrate when aligning the semiconductor chip with the package substrate during semiconductor packaging, and as an underfill, may redistribute stress and strain caused by a difference in thermal expansion coefficient between the semiconductor chip and the package substrate.

The adhesive layer 12 of the present invention, in a semi-cured state, has a lowest melt viscosity of 1000 Pa·s or less at about 150 to 160° C. Such an adhesive layer 12 is disposed between a semiconductor chip including bumps and a package substrate including bonding pads during packaging, and they are pressed under the conditions of a stage temperature of 130 to 150° C., a die bonder head at room temperature, 10 to 200 N, and 1 to 5 seconds. In such a case, a predetermined temperature is applied to a stage for the actual bonding and a stage of a die bonder, while the die bonder head is at room temperature. Accordingly, it is differentiated from the conventional art using a die bonder that necessarily applies a high temperature.

Specifically, since the adhesive layer 12 of the present invention has a lowest melt viscosity of about 1000 Pa·s or less at about 150 to 160° C., specifically in a range of about 100 to 900 Pa·s, and more specifically in a range of about 300 to 600 Pa·s, which is relatively low, such that it easily melts even by compression under certain conditions (e.g., about 150° C., 75 to 200 N, 1 to 3 seconds) to have fluidity. Accordingly, when the bump of the semiconductor chip is pre-bonded to the bonding pad of the package substrate, the adhesive layer 12 positioned between the bump of the semiconductor chip and the bonding pad of the package substrate is easily melted to fill an empty space between the bump and the bonding pad, and thus the connection reliability may be increased. In particular, since the adhesive layer 12 has high fluidity, it is possible to fill a fine empty space with a fine pitch.

In addition, since the adhesive layer 12 of the present invention may serve not only as an underfill but also as a flux, there is no need to apply a separate flux on the bonding pad or wash the flux, which is dissimilar to the conventional art. Accordingly, voids which may occur due to residues of flux or residues of flux washing solvent are substantially not generated. As such, the adhesive layer of the present invention is excellent in the gap-filling effect, and it is possible to minimize the generation of voids.

In particular, since the underfill film according to the present invention uses a chip placement method in which a semiconductor chip bonded with an adhesive layer is picked up and horizontally moved, aligned and bonded onto a package substrate supported by a bonding stage, it is necessary to control the physical properties of the adhesive layer 12 to be optimized with such a method. For example, when an onset temperature (Onset Temp.) of the adhesive layer 12 is controlled to be substantially equal to a pre-set pre-heat temperature (Ts) of the bonding stage, it may be stably bonded even when a compression process, e.g., pre-bonding to be described below, is performed under a certain condition, the production efficiency may be increased by simplifying the semiconductor chip transfer process and the bonding process.

As another example, the adhesive layer 12 may have an onset temperature of about 145±5° C. on a differential scanning calorimeter (DSC), specifically in a range of 143 to 147° C. As used herein, the onset temperature is at a time point at which curing of the adhesive layer 12 partially starts, and specifically, a curing reaction takes place as an anhydride group of an acid dianhydride curing agent present in the adhesive layer in a semi-cured state is ring-opened into a carboxyl group for a flux function. As such, by precisely controlling the onset temperature (Onset Temp.) of the adhesive layer 12 at which curing is initiated to be substantially the same as the pre-heat temperature (Ts) of the stage at which the packaging bonding is performed, it may be optimized for the chip placement method.

In addition, a peak temperature (Peak Temp.) of the adhesive layer 12 may be 165±5° C., and a temperature difference (ΔT) between the onset temperature and the peak temperature may be 25±5° C. As used herein, the peak temperature means a highest peak temperature in a DSC graph. When the adhesive layer 12 has the above-described onset temperature and peak temperature characteristics, it is possible to secure physical properties optimized for the chip placement method and to exhibit stable curing characteristics at high temperatures.

A thickness of the adhesive layer 12 is adjusted in consideration of the lowest melt viscosity of the adhesive layer. In an example, the thickness of the adhesive layer 12 may be in a range of 80 to 120% with respect to a distance (e.g., 100%) between the semiconductor chip and the package substrate.

As long as the adhesive layer 12 according to the present invention satisfies the aforementioned melt viscosity (M.V) and onset temperature (Onset Temp.) physical property values, components constituting the adhesive layer 12 and its composition are not particularly limited. The adhesive layer 12 may be made of a cured product or a semi-cured product of an adhesive resin composition. As a specific example of the adhesive resin composition, (a) an epoxy resin containing a liquid epoxy resin, a phenoxy resin and a polyfunctional epoxy resin; (b) an acid anhydride curing agent; (c) a nitrogen (N)-containing heterocyclic compound; and (d) a filler may be included.

More specifically, in the present invention, as a main resin component constituting the adhesive layer 12, at least three or more kinds including a liquid epoxy resin, a phenoxy resin, and a polyfunctional epoxy resin are mixed, and a mixing ratio thereof is adjusted to be within a predetermined range.

Among the at least three kinds of epoxy resins, the liquid epoxy resin is an epoxy resin in a liquid state at 25±5° C. and is a thermosetting resin. Such a liquid epoxy resin may impart adhesiveness and curability to the adhesive resin composition and may impart curing uniformity to the adhesive layer after curing.

Non-limiting examples of applicable liquid epoxy resins may include liquid bisphenol A-type epoxy resin, liquid bisphenol F-type epoxy resin, liquid naphthalene-type epoxy resin, liquid aminophenol-type epoxy resin, liquid hydrogenated bisphenol-type epoxy resin, liquid alicyclic epoxy resin, liquid alcohol ether-type epoxy resin, liquid cycloaliphatic-type epoxy resin, liquid fluorene-type epoxy resin, liquid siloxane-based epoxy resins, and the like, among which liquid bisphenol A-type epoxy resin and liquid bisphenol F-type epoxy resin, and liquid naphthalene-type epoxy resin are suitable in terms of adhesiveness, curability, durability, and heat resistance. These may be used either solely or as a mixture of two or more kinds thereof. Specifically, liquid epoxy resin products may include a bisphenol F-type epoxy resin (product name: YDF8170) manufactured by Nippon Steel & Sumikin Chemical, a bisphenol A-type epoxy resin (product name: EXA-850CRP) manufactured by DIC, a bisphenol F-type epoxy resin (product name: YDF870GS) manufactured by Nippon Steel & Sumikin Chemical, a naphthalene-type epoxy resin (product name: HP4032D) manufactured by DIC, an aminophenol-type epoxy resin (grade: JER630, JER630LSD) manufactured by Mitsubishi Chemical, a siloxane-based epoxy resin (product name: TSL9906) manufactured by Momentive Performance Materials, and 1,4-cyclohexanedimethanol diglycidyl ether (product name: ZX1658GS) manufactured by Nippon Steel & Sumikin Chemical, but embodiments are not limited thereto.

The phenoxy resin is a thermoplastic polymer containing an epoxy group at at least one end (e.g. terminal), and since an equivalent weight of the epoxy group in the molecule is significantly small as compared to a molecular weight, it participates in curing but may impart fluidity at high temperatures. Due to the phenoxy resin, the adhesive layer of the present invention may be molded into a film shape in a semi-cured (B-stage) state at room temperature (about 25±5° C.).

The applicable phenoxy resin is not particularly limited as long as it is a polymer containing a phenoxy group in a polymer chain, and an epoxy group at at least one end thereof.

For example, the phenoxy resin may be a compound represented by the following Chemical Formula 1, but embodiments are not particularly limited thereto.

[Chemical Formula 1]

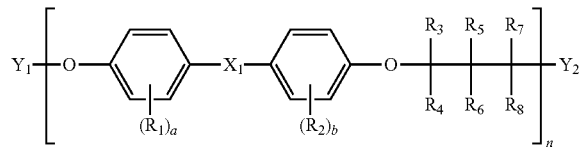

In Chemical Formula 1,
a and b are each an integer ranging from 1 to 4,
a plurality of $R_1$ and a plurality of $R_2$ are the same or different from each other, each independently being selected from the group consisting of hydrogen, halogen, a $C_1$ to $C_{10}$ alkyl group, a $C_3$ to $C_{20}$ cycloalkyl group, a $C_5$ to $C_{20}$ aryl group and a nitro group, and specifically, each independently being selected from the group consisting of hydrogen, halogen, a $C_1$ to $C_5$ alkyl group, a $C_3$ to $C_{10}$ cycloalkyl group, a $C_5$ to $C_{10}$ aryl group and a nitro group;
$R_3$ to $R_8$ are the same as or different from each other, each independently being hydrogen or a hydroxy group, provided that at least one of $R_3$ to $R_8$ is a hydroxy group;
$X_1$ is a single bond or a $C_1$ to $C_{10}$ alkylene group, and specifically a single bond or a $C_1$ to $C_5$ alkylene group,
$Y_1$ and $Y_2$ are the same as or different from each other, each independently being hydrogen, a hydroxy group or an epoxy group, provided that at least one of $Y_1$ and $Y_2$ is an epoxy group, and
n is an integer ranging from 30 to 400.

In addition, the polyfunctional epoxy resin is an epoxy resin containing at least two or more epoxy groups. Such a polyfunctional epoxy resin imparts electrical insulation, heat resistance, chemical stability, toughness, and moldability to the adhesive layer.

The applicable polyfunctional epoxy resin is not particularly limited as long as it is an epoxy resin containing two or more, specifically, two to five epoxy groups per molecule (monomer). Non-limiting examples of the polyfunctional epoxy resin may include an epoxy resin obtained by epoxidizing a condensate of phenol or alkyl phenols with hydroxybenzaldehyde, phenol novolak-type epoxy resins, cresol novolak-type epoxy resins, phenol aralkyl-type epoxy resins, biphenyl-type epoxy resins, bisphenol A-type epoxy resins, bisphenol F-type epoxy resins, linear aliphatic epoxy resins, alicyclic epoxy resins, heterocyclic epoxy resins, epoxy resin containing spiro ring, xylok-type epoxy resins, polyfunctional epoxy resins, naphthol novolak-type epoxy resins, bisphenol A/bisphenol F/bisphenol AD novolak-type epoxy resins, bisphenol A/bisphenol F/bisphenol AD glycidyl ether epoxy resins, bishydroxybiphenyl-type epoxy resins, dicyclopentadiene-based epoxy resins, naphthalene-based epoxy resins, and the like. Among them, polyfunctional epoxy resins that are non-liquid at 25±5° C. are preferable. In such an embodiment, the non-liquid phase at 25±5° C. means an epoxy resin that is semi-solid or solid at 25±5° C., and also includes an epoxy resin close to the solid phase.

A content ratio among the at least three kinds of epoxy resins constituting the adhesive layer 12, for example, a liquid epoxy resin, a phenoxy-based resin, and a polyfunctional epoxy resin, is preferably adjusted to a predetermined range in consideration of adhesiveness and filling properties. As an example, a use ratio (mixing ratio) among the polyfunctional epoxy resin, the phenoxy resin, and the liquid epoxy resin may be 4:3 to 4:2 to 3 by weight, specifically 4:3 to 3.5:2 to 2.5 by weight. When the above-mentioned epoxy mixing ratio is satisfied, by controlling the lowest melt viscosity and the onset temperature at which curing starts to a predetermined range, it is possible to secure the connection reliability of the package through improvement of adhesion and fillability, and it is optimized to a chip placement method such that it is possible to increase production efficiency by simplifying the semiconductor chip transfer and bonding process.

The adhesive resin composition constituting the adhesive layer 12 according to the present invention includes an acid anhydride-based curing agent. The acid anhydride-based curing agent may cure at least one of a liquid epoxy resin, a phenoxy resin, and a polyfunctional epoxy resin, and exhibit flux properties.

Non-limiting examples of the applicable acid anhydride-based curing agent may include tetrahydrophthalic anhydride, methyl tetrahydrophthalic anhydride, methyl hexahydrophthalic anhydride, hexahydrophthalic anhydride, trialkyl tetrahydrophthalic anhydride, methyl cyclohexenedicarboxylic anhydride, phthalic anhydride, maleic anhydride, pyromellitic anhydride, and the like, which may be used either solely or as a mixture of two or more kinds thereof.

A content of the acid anhydride curing agent is not particularly limited, and may be appropriately adjusted within a range known in the art. For example, the acid anhydride curing agent may be included in a range of 0.3 to 1.0 equivalents of anhydride, and specifically may be in a range of 0.4 to 0.7 equivalents, with respect to 1 equivalent of the epoxy resin.

In addition to the acid anhydride-based curing agent described above, the adhesive resin composition of the present invention may further include one or more curing agents known in the art for curing the epoxy resin. For example, aromatic amine-type curing agents, such as meta-phenylenediamine, diaminodiphenylmethane, diaminodiphenyl sulfone; aliphatic amine curing agents such as diethylenetriamine and triethylenetetraamine; phenolic curing agents such as phenol aralkyl-type phenol resins, phenol novolak-type phenol resins, xylok-type phenol resins, cresol novolak-type phenol resins, naphthol-type phenol resins, terpene-type phenol resins, polyfunctional-type phenol resins, dicyclopentadiene-type phenol resins, naphthalene-type pheno resins, phenolic curing agents such as novolak-type phenolic resins synthesized from bisphenol A and resol; and latent curing agents such as dicyandiamide, which may be used either solely or as a mixture of two or more kinds thereof.

The adhesive resin composition constituting the adhesive layer 12 according to the present invention includes a nitrogen (N)-containing heterocyclic compound. The nitrogen (N)-containing heterocyclic compound is a kind of curing catalyst capable of accelerating curing, and may not only control the curing rate, but also ensure high-temperature stability of the adhesive layer.

The nitrogen (N)-containing heterocyclic compound may be at least one selected from the group consisting of a compound represented by the following Chemical Formula 2 and a compound represented by the following Chemical Formula 3.

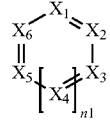

[Chemical Formula 2]

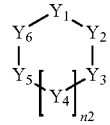

[Chemical Formula 3]

In Chemical Formulas 2 and 3, n1 is 1 or 2, n2 is an integer in a range of 0 to 2, $X_1$ to $X_6$ are the same as or different from each other, each independently representing N or $C(R_1)$, provided that at least one of $X_1$ to $X_6$ is N; and $Y_1$ to $Y_6$ are the same as or different from each other, each independently representing $N(R_2)$ or $C(R_3)(R_4)$, provided that at least one of $Y_1$ to $Y_6$ is $N(R_2)$, where the plurality of $C(R_1)$ are the same as or different from each other, the plurality of $N(R_2)$ are the same as or different from each other, and the plurality of $C(R_3)(R_4)$ are the same or different from each other, and $R_1$, $R_2$, $R_3$ and $R_4$ are each independently selected from the group consisting of hydrogen, deuterium (D), halogen, a cyano group, a nitro group, a $C_1$ to $C_{20}$ alkyl group, a $C_2$ to $C_{20}$ alkenyl group, and $C_2$ to $C_{20}$ alkynyl group.

Specifically, in Chemical Formula 2, one or two of $X_1$ to $X_6$ may be N, and the others may be $C(R_1)$.

In addition, in Chemical Formula 3, one or two of $Y_1$ to $Y_6$ may be $N(R_2)$, and the others may be $C(R_3)(R_4)$.

In addition, in Chemical Formulas 2 and 3, $R_1$, $R_2$, $R_3$ and $R_4$ may each independently be selected from the group consisting of: hydrogen, deuterium (D), halogen, a cyano group, a nitro group, a $C_1$ to $C_{12}$ alkyl group, a $C_2$ to $C_{12}$ alkenyl group, and a $C_2$ to $C_{12}$ alkynyl group.

Examples of the compound represented by Chemical Formula 2 may include, but are not limited to, a pyrazine-based compound, a pyridine-based compound, and an imidazole-based compound. Specifically, a non-limiting example of the compound represented by Chemical Formula 2 may be a compound represented by Chemical Formula 2a below.

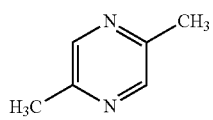

[Chemical Formula 2a]

Examples of the compound represented by Chemical Formula 3 may include, but are not limited to, piperazine-based compounds. Specifically, non-limiting examples of the compound represented by Chemical Formula 3 may be a compound represented by Chemical Formula 3a below, or a compound represented by Chemical Formula 3b below.

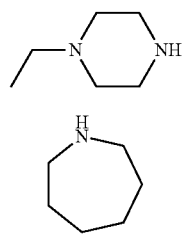

[Chemical Formula 3a]

[Chemical Formula 3b]

As an example, the N-containing heterocyclic compound may include at least one selected from the group consisting of a pyrazine-based compound, a pyridine-based compound, and a piperazine-based compound.

In the adhesive resin composition of the present invention, a content of the N-containing heterocyclic compound is preferably adjusted in consideration of the type and content of the acid anhydride-based curing agent in use. For example, the N-containing heterocyclic compound may be included in an amount of 0.005 equivalents or more and less than 0.02 equivalents, and specifically in a range of 0.01 to 0.015 equivalents, with respect to 1 equivalent of the acid anhydride curing agent.

The adhesive resin composition forming the adhesive layer 12 according to the present invention includes a conventional filler known in the art. The filler may not only exhibit thixotropic properties to control melt viscosity, but also improve adhesion and lower the coefficient of thermal expansion.

Such fillers may be organic fillers or inorganic fillers. Specifically, the inorganic filler may include, for example, metal components such as gold powder, silver powder, copper powder, nickel powder, and the like; non-metallic components such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, ceramic, and the like, and the organic filler may include, for example, carbon, rubber-based filler, polymer-based filler, and the like, but embodiments are not limited thereto. These may be used either solely or as a mixture of two or more kinds thereof.

The shape and size of the filler are not particularly limited, and for example, the shape of the filler may be angular or spherical, and an average particle diameter thereof may be in a range of about 10 to 100 nm. If the average particle diameter of the filler is within the aforementioned range, mechanical properties of the cured product may be further improved. According to one example, the filler may be silica having an average particle diameter in a range of about 10 to 100 nm.

A content of the filler is not particularly limited, and for example, a total amount of the adhesive resin composition (e.g., with respect to solid content) may be a remaining amount adjusted to be 100 percentage by weight (wt %), and specifically, may be in a range of about 10 to 50 parts by weight, specifically in a range of 20 to 40 parts by weight with respect to the total amount (e.g., 100 parts by weight) of the epoxy resin. When the content of the filler is within the above-mentioned numerical range, an adhesive layer having a low coefficient of thermal expansion (CTE) is formed, such that a difference in coefficient of thermal expansion between the substrate and the semiconductor device may be small, thereby capable of minimizing the occurrence of warpage or cracks.

As an example of the present invention, in the adhesive resin composition forming the adhesive layer 12, a content of the epoxy resin (i.e., a total content of the polyfunctional epoxy resin, the phenoxy resin and the liquid epoxy resin) may be in a range of about 40 to 60 wt % with respect to the total amount (e.g., 100 parts by weight) of the adhesive resin composition, a content of the acid anhydride-based curing agent may be in a range of about 10 to 20 wt % with respect to the total amount of the adhesive resin composition, and a content of the N-containing heterocyclic compound may be in a range of about 0.1 to 0.5 wt % with respect to the total amount of the adhesive resin composition. In addition, a remaining amount of a solvent that satisfies the total weight of the composition may be included. In such an embodiment, the solvent is not particularly limited as long as it is included in the remaining amount that satisfies 100 parts by weight of the composition, and may be, for example, 30 to 60 parts by weight, and specifically 30 to 50 parts by weight. In such a case, a use ratio (mixing ratio) among the polyfunctional epoxy resin, the phenoxy resin, and the liquid epoxy resin constituting the entire epoxy resin may be 4:3 to 4:2 to 3 by weight.

The solvent is not particularly limited as long as it has excellent miscibility with the epoxy resin and may disperse them uniformly or dissolve them stably. Examples of such a solvent may be water, an organic solvent, or a mixed solvent thereof, and non-limiting examples thereof may include alcohol-based solvents such as methyl alcohol, ethyl alcohol, isopropyl alcohol, butyl alcohol, and the like; ether-based solvents such as methyl cellosolve, ethyl cellosolve, butyl cellosolve, propylene glycol monomethyl ether, propylene glycol monoethyl ether, cellosolve acetate, and the like; ketone-based solvents such as methyl ethyl ketone, cyclohexanone, acetone, diacetone alcohol, and the like; ester-based solvents such as methyl acetate and ethyl acetate; halogenated hydrocarbon solvents such as chloroform, methylene chloride, tetrachloroethane, and the like, and other solvents such as dimethyl sulfoxide, ethylene glycol, glycerin, sorbitol, formamide, N-methyl formamide, N,N-dimethylformamide, acetamide, N-methyl acetamide, N-dimethylacetamide, N,N-dimethylformamide, tetrahydrofuran, N-methyl-2-pyrrolidone, nitromethane, acetonitrile, and the like. These may be used either solely or as a mixture of two or more thereof.

Since the adhesive layer 12 of the present invention having the above composition is easy to handle, has excellent adhesion, and has a melt viscosity of about 1000 Pa·s or less, which is low, at about 150 to 160° C. as well, occurrence of voids may be significantly reduced, filling properties may be excellent, and thus connection reliability may be improved. In addition, since the onset temperature of the adhesive layer is adjusted to be substantially the same as the preheat temperature (Ts) of the bonding stage, it is optimized for the chip placement method so that semiconductor packaging may be easily configured.

The adhesive resin composition of the present invention may optionally further include additives commonly known in the art in addition to the above-described components, as needed, according to the purpose and environment of use of the composition, as long as it does not impair inherent properties of the adhesive layer. For example, solvents such as acetone, methyl ethyl ketone, toluene, and ethyl acetate, adhesion promoters, coupling agents, antistatic agents, contact property enhancers, wettability improvers, leveling enhancers, and the like may be included, but embodiments are not limited thereto.

A content of the additives is not particularly limited and may be used in a conventional range known in the art. For example, it may be included in a range of about 0.01 to 10 wt % with respect to the total amount of the resin composition.

The above-described adhesive resin composition may be prepared through a method commonly known in the art. For example, the liquid epoxy resin, the phenoxy resin, the polyfunctional epoxy resin, the acid anhydride-based curing agent, the nitrogen (N)-containing heterocyclic compound, the filler, and optional additives may be mixed and stirred at room temperature or appropriately elevated temperature using mixing equipment such as ball mill, bead mill, 3roll mill, basket mill, dyno mill, planetary, and the like, and thus the adhesive resin composition may be prepared.

The underfill film according to the present invention may be manufactured by a method commonly known in the art. For example, the underfill film may be manufactured by: diluting the adhesive resin composition obtained through the above-described method with an organic solvent for dilution as needed to mix them to an appropriate concentration to facilitate film formation, and then coating it to a base and drying.

The coating and drying method is not particularly limited as long as it is a method capable of forming a coating film, such as bar coating, gravure coating, comma roll coating, roll reverse coating, roll knife coating, die coating, or lip coating.

Since the underfill film of the present invention configured as described above has a lowest melt viscosity that is low, occurrence of voids may be minimized during pre-bonding between the semiconductor chip and the package substrate, and the underfill film may have excellent filling properties, thus improved in terms of the connection reliability of the package, and may be applicable to a fine pitch. In addition, by adopting a chip placement method, a mass reflow process may be performed by simplifying the transfer and bonding process of the semiconductor chip, which is dissimilar to the conventional art.

Hereinafter, an underfill film 10B according to a second embodiment of the present invention illustrated in FIG. 2 will be described.

As illustrated in FIG. 2, the underfill film 10B of the present invention includes a base (hereinafter, "first base") 11; an adhesive layer 12 disposed on one surface of the base; and another base (hereinafter, "second base") 13 disposed on another surface of the adhesive layer 12.

The first base 11 and the adhesive layer 12 applicable in the present invention are the same as the base and the adhesive layer described in the first embodiment, respectively, and thus descriptions thereof will be omitted.

In the present invention, the second base 13 is a portion disposed on another surface of the adhesive layer 13 to protect a surface thereof, while supporting the adhesive layer, and is delaminatable (e.g., detachable) to be delaminated and removed when the film is in use.

The second base 13 is substantially the same as or different from the first base, and detailed descriptions thereof are the same as those described with respect to the base of the first embodiment, and thus will be omitted.

<Method for Manufacturing Semiconductor Package>

Another embodiment of the present invention provides various methods of manufacturing a semiconductor package using the above-described underfill films 10A and 10B. In particular, since the adhesive layer of the underfill films 10A and 10B has a lowest melt viscosity of about 1000 Pa·s or less, which is low, at about 150 to 160° C., and the onset temperature of the adhesive layer is substantially equal to the pre-heat temperature of the bonding stage, even when pre-bonding (e.g., compression) is performed under certain conditions, the adhesive layer may readily have fluidity and fill the gap between the semiconductor chip and the package substrate without voids, thereby improving the connection reliability of the semiconductor package. Accordingly, according to the present invention, by using the above-described underfill film, it is possible to simplify the manufacturing process of the semiconductor package, improve production efficiency, and manufacture a semiconductor package having excellent connection reliability.

In particular, in the conventional semiconductor packaging, it was necessary to apply a specific high temperature and high pressure to each of the bonding stage and the die bonder head. On the other hand, in the present invention, by using the underfill film adjusted to the above-described physical properties, the semiconductor packaging may be completely performed without separately applying a high temperature to the die bonder head, and thus mass productivity may be improved by simplifying the manufacturing process and reducing costs. In addition, since the electrical connection is made in a state in which voids are minimized due to a subsequent reflow process, the reliability of the package may be improved.

Hereinafter, a method for manufacturing a semiconductor package according to an embodiment of the present invention will be described. However, the above-described semiconductor package may be manufactured without limitation according to a conventional method known in the art and is not limited only by the following manufacturing method. If necessary, the steps of each process may be modified or selectively mixed.

According to an embodiment, a method for manufacturing the semiconductor package may include: (i) bonding the adhesive layer of the underfill film on a bump of a semiconductor chip provided with the bump (S100); (ii) picking up the bump of the semiconductor chip to which the adhesive layer is bonded, and aligning it on a bonding pad of a package substrate supported on a bonding stage (S200); (iii) putting the aligned semiconductor chip and the package substrate into a pressure chamber oven (S300); (iv) melting the bump of the semiconductor chip to connect the semiconductor chip and the package substrate (S400); and (v) curing the adhesive layer disposed between the connected semiconductor chip and package substrate (S500).

Hereinafter, a method for manufacturing a semiconductor package according to the present invention will be described for each process with reference to FIGS. 3 to 6.

Hereinafter, a method for manufacturing a semiconductor package according to the present invention will be described for each process step with reference to FIGS. 3 to 6.

Figure 3:
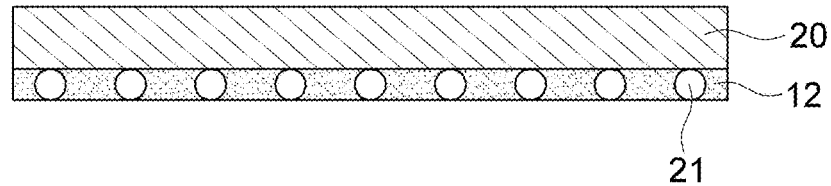
FIGS. 3 to 6 are cross-sectional views illustrating each process to schematically describe a method for manufacturing a semiconductor package according to the present invention.

(a) Disposing Adhesive Layer on Semiconductor Chip;

As illustrated in FIG. 3, the adhesive layer 12 of the aforementioned underfill films 10A and 10B is disposed on bumps 21 of a semiconductor chip 20 provided with the bumps 21 (hereinafter, "S100 step").

In general, in the semiconductor chip 20, terminals (pads) (not illustrated) for connecting an internal electronic circuit to the outside are formed along an edge of the chip, and, if necessary, they may be formed in one row or two rows along a center portion of the chip.

The bumps 21 are formed on the terminals of the semiconductor chip, respectively. The bump is an external terminal electrically connecting the substrate and the semiconductor chip during packaging and may include a solder bump or a gold (Au) bump.

In the present invention, as illustrated in FIG. 3, the bases 11 and 13 are separated from the underfill films 10A and 10B, and only the adhesive layer 12 is disposed on the side of the bump 21 of the semiconductor chip. In such an embodiment, the semiconductor chip 20 provided with the bumps 21 may be press-laminated on the adhesive layer 12 at a pressure in a range of about 30 to 100 N. In addition, if necessary, the semiconductor chip 20 may be laminated under pressure at a temperature lower than the onset temperature of the adhesive layer, for example, 50 to 150° C. Accordingly, the adhesive layer is pressed on the bumps of the semiconductor chip in a semi-cured state (B-stage). In such a case, since the adhesive layer may serve not only as an underfill but also as a flux, the present invention does not require washing the bumps with a flux, which is dissimilar to the conventional art.

(b) Aligning Semiconductor Chip and Substrate

The semiconductor chip 20 on which the adhesive layer 12 is pressed in step S100 is aligned on the package substrate 30 (hereinafter, "S200").

Specifically, in the present invention, a chip placement mechanism is employed for a process of transferring the semiconductor chip and a process of aligning and bonding the transferred semiconductor chip on the package substrate supported by the bonding stage.

In such a case, it is preferable that the bonding stage on which the package substrate is seated is preheated in advance to a set temperature (Ts) substantially equal to the onset temperature (Onset Temp.) of the adhesive layer provided on the underfill film. For example, the preheat temperature (Ts) of the bonding stage may be 145±5° C.

As the package substrate 30 supported by the bonding stage, any conventional substrate known in the art may be used without limitation. As an example, a substrate having a circuit pattern (not illustrated) formed on one surface thereof, for example, a printed circuit board (PCB) may be used. Bonding pads 31 are formed on the package substrate 30 in an area corresponding to the position of the bumps 21 of the semiconductor chip 20.

Figure 4:
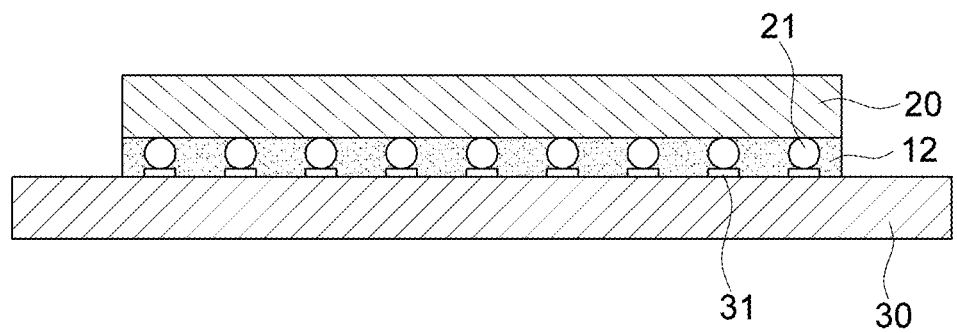

In the present invention, as illustrated in FIG. 4, the semiconductor chip 20 is mounted on the package substrate 30 so that the semiconductor chip 20 on which the bumps 21 are formed is arranged on the bonding pads 31. Specifically, the bump 21 of the semiconductor chip 20 may be pressed on the bonding pad 31 of the package substrate 30 under the conditions of a stage temperature of about 130 to 150° C., a die bonder head at room temperature RT, 10 to 200 N, and 1 to 5 seconds, and thus the package substrate 30 and the semiconductor chip 20 may be pre-bonded to each other. In such an embodiment, the adhesive layer 12 disposed between the semiconductor chip 20 and the package substrate 30 flows because its lowest melt viscosity is low, as described above.

In the present invention, since the adhesive layer 12 contains a component capable of serving as a flux, it is unnecessary to apply flux to the bonding pad 31 of the package substrate 30 prior to step S200, which is dissimilar to the conventional art.

(c) Removing Voids

The semiconductor chip and the package substrate aligned in S200 are put into a pressure chamber oven (PCO) under certain conditions (hereinafter, "S300").

The conditions for the pressure chamber oven are not particularly limited, and for example, voids may be removed in an oven in a range of about 100 to 200° C., and specifically in a range of about 110 to 150° C.

(d) Melting of Bump

Figure 5:
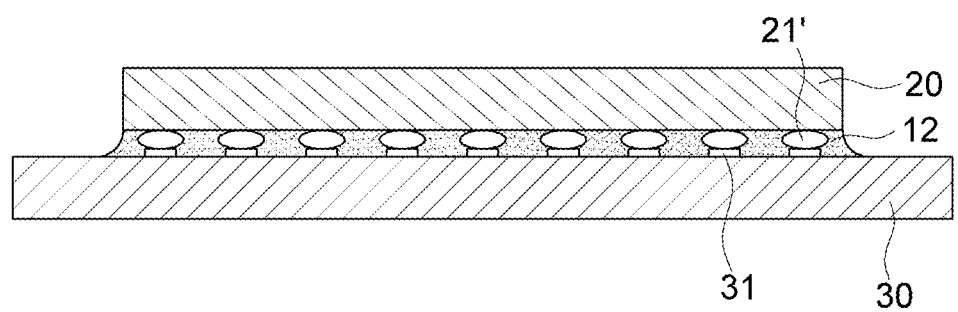

As illustrated in FIG. 5, the bump 21 of the semiconductor chip 20 is melted to electrically and mechanically connect the semiconductor chip 20 and the package substrate 30 (hereinafter, "S400").

In such a case, the bump is reflowed, and the bump is melted such that the semiconductor chip 20 and the package substrate 30 are electrically and mechanically connected.

In such an embodiment, the adhesive layer 12 disposed between the semiconductor chip 20 and the package substrate 30 is also melted, so that a void area ratio in the adhesive layer is reduced. For example, after the reflow process, the void area ratio in the adhesive layer 12 may be 1% or less per 1 m². Accordingly, the connection reliability of the semiconductor package manufactured according to the present invention may be further improved.

(e) Curing of Adhesive Layer

Figure 6:
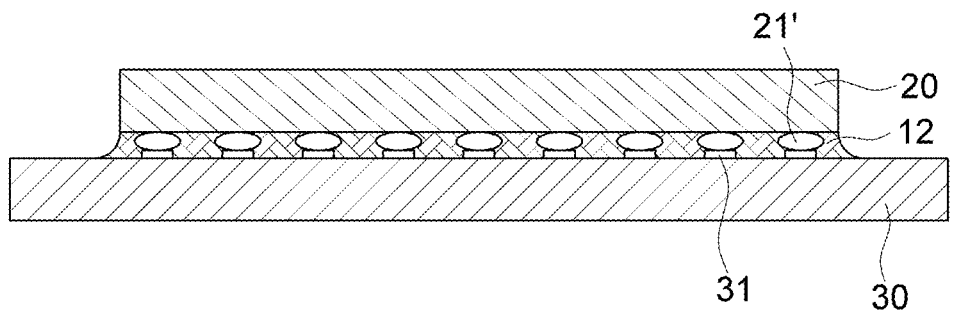

As illustrated in FIG. 6, the adhesive layer 12 disposed between the semiconductor chip 20 and the package substrate 30 that are connected in step S300 is cured (hereinafter, "S500").

Since the adhesive layer 12 of the present invention has an onset temperature of about 145±5° C., S500 may be performed at a temperature higher than the above-described onset temperature, for example, about 160° C. or higher, and specifically in a range of 160 to 250° C.

A curing time of the adhesive layer may be appropriately adjusted according to the curing temperature, and may be, for example, in a range of about 0.5 to 3 hours.

Subsequently, if necessary, subsequent processes known in the art may be performed. For example, the package substrate may be cut into unit substrate shapes for singulation. In such a case, the process of completely cutting the package substrate in the form of a printed circuit board into package units may be performed using a conventional process known in the art, for example, a saw blade or laser cutting.

Hereinafter, the present invention will be described in detail through Embodiments, but the following Embodiments and Experimental Examples are merely illustrative of one aspect of the present invention, and the scope of the present invention is not limited by the Embodiments and Experimental Examples below.

Embodiment 1

1-1. Preparation of Adhesive Resin Composition

An adhesive resin composition of Embodiment 1 was prepared by mixing each component according to the composition illustrated in Table 1 below. A content unit of each component described in Table 1 is in parts by weight (weight ratio), and specifically, the content of the filler was with respect to 100 parts by weight of the epoxy resin. In addition, the content of the curing agent was set with respect to 1 equivalent of epoxy, and the content of the catalyst was set with respect to 1 equivalent of the curing agent in use.

1-2. Preparation of Underfill Film

On one surface of a PET release film (thickness: 38 μm), each of the adhesive resin compositions prepared in Embodiment 1-1 was die-coated, and then dried to form an adhesive layer (thickness: 18 μm), and accordingly, a non-conductive adhesive film was prepared.

Experimental Embodiment 2: Evaluation of Packaging

After semiconductor packaging was performed according to the chip placement method using the underfill film prepared in Embodiment 1, the packaged bonding cross-section was evaluated.

Figure 7:
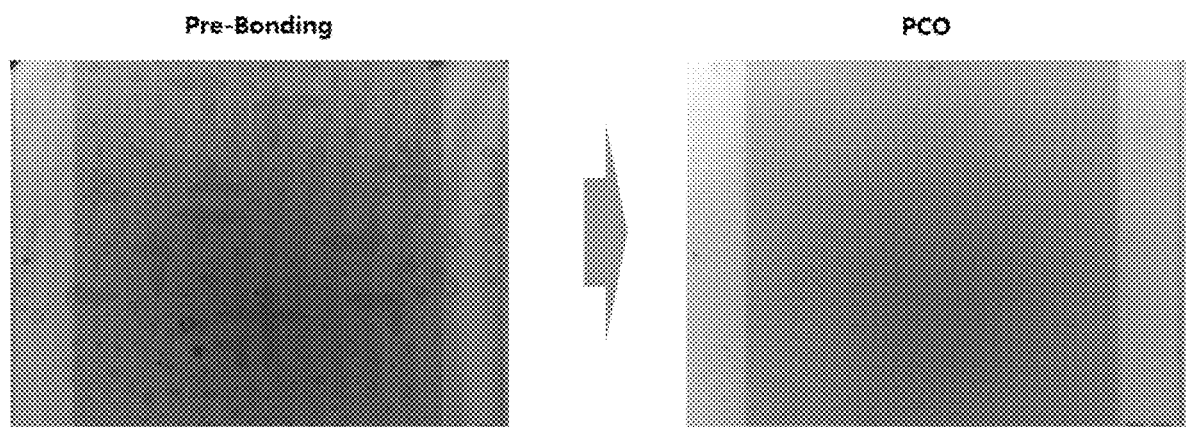
FIG. 7 is a photograph illustrating a semiconductor package, viewed from the above, using the underfill film according to the first embodiment.

FIG. 7 is photograph illustrating an adhesive layer, viewed from the above, after the bumps of the semiconductor chip and the bonding pads of the package substrate are pre-bonded and put into a pressure chamber oven (PCO). It may be appreciated that an area of voids in the adhesive layer after PCO was significantly reduced.

Figure 8:
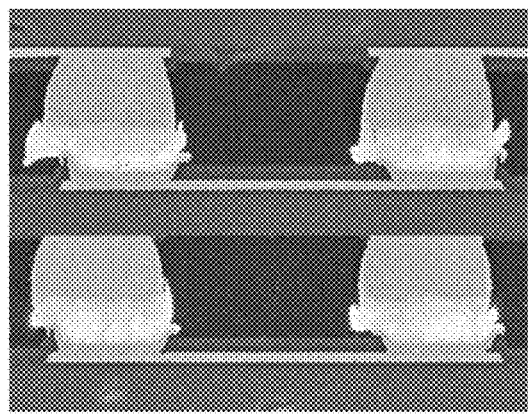
FIG. 8 is a cross-sectional photograph illustrating a semiconductor package using the underfill film according to the first embodiment.

FIG. 8 is a cross-sectional photograph after the adhesive layer of the underfill film is cured after the reflow process.

As a result of the experiment, it may be appreciated that in the underfill film of the present invention, the bumps of the semiconductor chip and the bonding pads of the package substrate were stably bonded not only after curing, but also in a state of being pre-bonded (see FIG. 8 below).

TABLE 1

| Adhesive resin composition | | Embodiment 1 (B538) | Embodiment 2 | Embodiment 3 | Comp. example 1 | Comp. Embodiment 2 |
|---|---|---|---|---|---|---|
| Epoxy resin | A) polyfunctional epoxy (KDCP-130) | 44.4 | 42.1 | 42.1 | 40 | 20 |
| | B) Phenoxy epoxy (YP-70) | 33.4 | 36.8 | 31.6 | 40 | 20 |
| | C) Liquid epoxy (YD-128) | 22.2 | 21.1 | 26.3 | 20 | 20 |
| | Epoxy ratio (A:B:C) | 4:3:2 | 4:3.5:2 | 4:3:2.5 | 4:4:2 | 442 |
| Curing agent | MHHPA | 0.5 equivalents | 0.5 | 0.5 | 0.5 | 0.5 |
| Catalyst | 2E4MZ-A | 0.01 equivalents | 0.01 | 0.01 | 0.02 | — |
| | 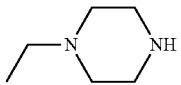 | — | — | — | — | 0.1 |
| Filler | Silica | 30.0 | 30 | 30 | 30 | 30 |
| Viscosity | Lowest melt viscosity (MV, Pa s) | 653 | 922 | 477 | 1408 | 881 |
| DSC (° C.) | Onset Temp. | 145 | 145 | 144 | 130 | 174 |
| | Peak Temp. | 165 | 165 | 165 | 155 | 190 |
| | ΔT | 20 | 20 | 21 | 25 | 16 |

* YD-128: KUKDO Chemical co., Ltd.
* YP-70: KUKDO Chemical co., Ltd.
* KDCP-130: KUKDO Chemical co., Ltd.
* MHHPA: Methylhexahydrophthalic anhydride
* 2E4MZ-A: Imidazole-based (1-cyanoethyl-2-ethyl-4-methyl imidazole)

Experimental Embodiment 1: Evaluation of Physical Properties

The physical properties of the underfill film prepared in Embodiment 1 were measured as follows, and the measurement results are shown in Table 1 above.

1) Onset Temperature

An onset temperature of the adhesive layer of the underfill film was measured using a differential scanning calorimetry (DSC).

2) Melt Viscosity

A viscosity of the adhesive layer of the underfill film was measured using a rheometer while increasing the temperature from 50° C. to 300° C. at a rate of 10° C. per minute.

As set forth hereinabove, according to one or more embodiments of the present invention, by providing an adhesive layer having a melt viscosity and an onset temperature adjusted to a predetermined range, a chip placement method may be applied such that the semiconductor chip transfer and bonding process may be simplified and automated, thereby achieving mass productivity. In addition, the connection reliability of the package may be improved. Accordingly, the underfill film of the present invention may be usefully applied to a semiconductor device and a manufacturing process thereof in the art. The effect according to the present invention is not limited by the contents exemplified above, and more various effects are included in the present specification.

What is claimed is:

1. An underfill film for semiconductor packages, comprising:
   a base; and
   an adhesive layer disposed on one surface of the base, having a melt viscosity in a range of 300 to 1000 Pa·s at 150 to 160° C., and having an onset temperature of 145±5° C. on a differential scanning calorimeter (DSC),
   wherein the adhesive layer is a cured product or a semi-cured product of an adhesive resin composition, the adhesive resin composition comprising:
   (a) an epoxy resin containing a liquid epoxy resin, a phenoxy resin and a polyfunctional epoxy resin;
   (b) an acid anhydride curing agent;
   (c) a nitrogen (N)-containing heterocyclic compound; and
   (d) a filler.

2. The underfill film for semiconductor packages of claim 1, wherein the underfill film is used in a chip placement manner for picking up a semiconductor chip to which the adhesive layer is bonded and bonding it to a package substrate supported by a bonding stage.

3. The underfill film for semiconductor packages of claim 2, wherein the onset temperature of the adhesive layer is substantially equal to a preset pre-heat temperature (Ts) of the bonding stage.

4. The underfill film for semiconductor packages of claim 1, wherein a thickness of the adhesive layer is in a range of 80 to 120% of a gap between the semiconductor chip and the package substrate.

5. The underfill film for semiconductor packages of claim 1, wherein the adhesive layer has a peak temperature of 165±5° C. on a differential scanning calorimetry (DSC), and
   a difference between the onset temperature and the peak temperature is 25±5° C.

6. The underfill film for semiconductor packages of claim 1, wherein a mixing ratio of the polyfunctional epoxy resin, the phenoxy resin, and the liquid epoxy resin is 4:3 to 4:2 to 3 by weight.

7. The underfill film for semiconductor packages of claim 1, wherein the acid anhydride curing agent is included in an amount in a range of 0.3 to 1.0 equivalents of anhydride with respect to 1 equivalent of the epoxy resin.

8. The underfill film for semiconductor packages of claim 1, wherein the nitrogen-containing heterocyclic compound is included in an amount of 0.005 equivalents or more and less than 0.02 equivalents with respect to 1 equivalent of the acid anhydride curing agent.

* * * * *